United States Patent [19]

Kim

[11] Patent Number: 5,024,366
[45] Date of Patent: Jun. 18, 1991

[54] DESOLDERING VAT

[76] Inventor: Henry I. Kim, 12665 Salmon River Rd., San Diego, Calif. 92129

[21] Appl. No.: 557,682

[22] Filed: Jul. 25, 1990

Related U.S. Application Data

[63] Continuation-in-part of Ser. No. 403,168, Sep. 5, 1989.

[51] Int. Cl.⁵ .......................... B23K 3/00; B23K 3/06
[52] U.S. Cl. ..................... 228/56.1; 228/56.5
[58] Field of Search .............. 228/56.1, 56.2, 19, 228/21, 179, 191, 259, 264; 118/428, 429

[56] References Cited

U.S. PATENT DOCUMENTS

| | | |
|---|---|---|
| 88,410 | 3/1869 | Pratt et al. .................. 228/56.1 |
| 2,247,132 | 6/1941 | Przyborowski ................ 228/259 |
| 3,815,806 | 6/1974 | Paxton ....................... 228/56.2 |
| 4,506,820 | 3/1985 | Brucker ...................... 228/56.1 |

Primary Examiner—Sam Heinrich
Attorney, Agent, or Firm—Ralph S. Branscomb

[57] ABSTRACT

A desoldering vat has a central, elongated solder pot which is filled to the brim with solder in use, so that depending component contact pins inserted through and soldered to a circuit board can be immersed in the meniscus of the liquid solder mass to melt the solder and permit removal of the component from the circuit board. A moat is defined around the central solder pot to catch the inevitable spills of solder and permit its replacement into the vat, and multiple adjustable brace bars defined on opposite sides of the central vat are used to support the hands or the circuit board itself while the unit is being used.

6 Claims, 1 Drawing Sheet

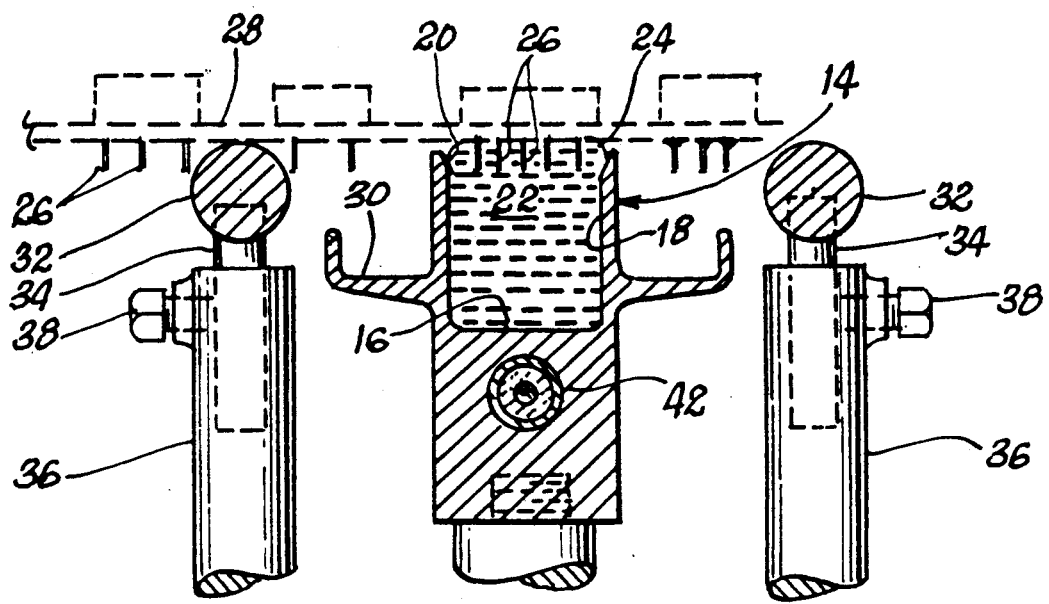
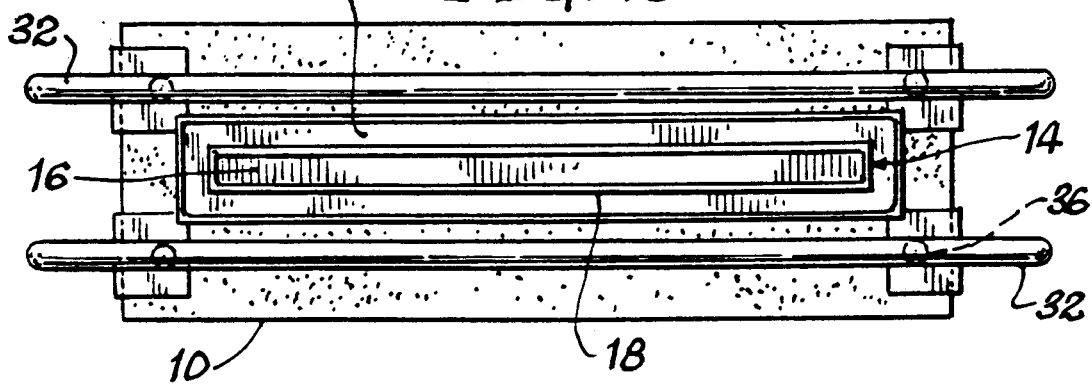
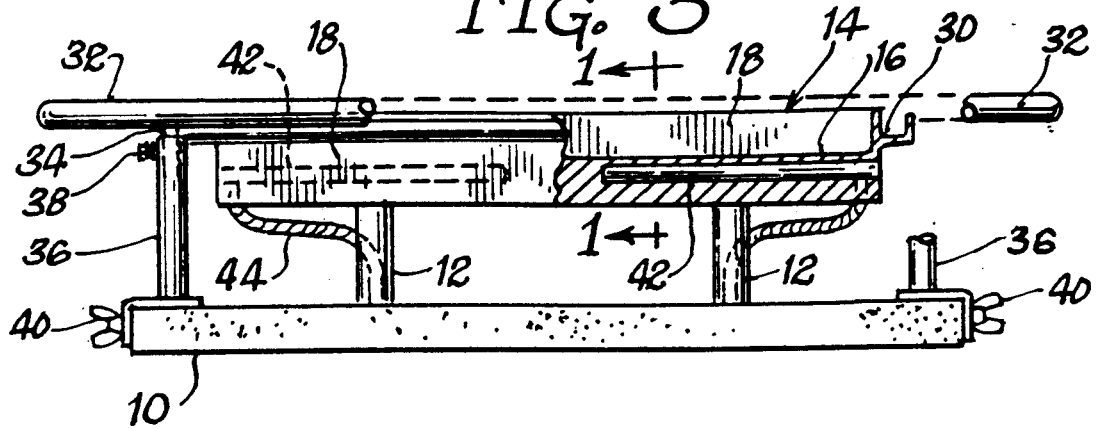

DESOLDERING VAT

This invention and patent application represent a continuation-in-part of patent application Ser. No. 403,168 filed Sept. 5, 1989 on a DESOLDERING VAT.

BACKGROUND OF THE INVENTION

Both the parent invention and this invention pertain to the removal of soldered components from a circuit board. With the multiple pins of integrated circuits and other components, desoldering faulty components to permit their removal from a circuit board requires that all of the contacts, or at least all of the contacts in a single contact row, be heated and desoldered at the same time.

The invention of the parent case accommodated this need by providing a long, thin solder pot designed to heat either a single line of contact pins extending through a circuit board, or a pair of fairly closely spaced rows of pins in a dual in-line package at the same time. That invention utilized a pair of spaced shields alongside the central vat to prevent the worker using the unit from burning his or her fingers, and also had four separate hand or board braces supported along the opposite sides of the central solder pot.

The instant invention represents improvements over the first invention, developed with the benefit of more extended use the desoldering vat of the first invention.

SUMMARY OF THE INVENTION

The improvements indicated above include a moat which surrounds the central soldering pot in its entirety, so that the solder which is inevitably spilled over the edge of the solder pot is captured and can be recycled into the solder pot.

Additionally, the four adjustable hand and board braces that characterized the first desoldering pot have been replaced by two braces, each of which spans the entire length of the pot and actually extends out over the ends. This construction simplifies the desoldering vat both in construction and in use.

The new unit has the advantages of the early unit, adds the spilled solder re-capture capability, and provides for simpler manufacturing and easier use than the former unit.

BRIEF DESCRIPTION OF THE DRAWINGS

FIG. 1 is a section taken along line 1—1 of FIG. 3 illustrating the unit in use;

FIG. 2 is a top plan view of the invention; and,

FIG. 3 is a side elevation view of the unit with portions cut away and portions shown in phantom.

DETAILED DESCRIPTION OF THE PREFERRED EMBODIMENT

The invention is shown somewhat diagrammatically in this application, because the details of construction, which are not subject to claims in this patent, are set forth in the parent application.

The unit has a stand 10 with a pair of spaced posts 12 which support the central soldering pot 14. The solder pot is a cast unit in the preferred embodiment and can be cast from aluminum, iron or other heat-proof material.

The central solder reservoir 16 of the pot is about $\frac{3}{4}''$ wide and has sidewalls 18 with tapered upper edges 20. The taper of the tops of the side edges causes the mass of molten solder 22 to form a crisp, relatively large-radiused meniscus 24 so that the solder actually protrudes above the edges of the top slightly to insure the maximum solder contact with the pins 26 depending from the board 28. Alongside the solder pot is a moat 30. This moat is molded integrally with the pot, and although it could be provided on one side of the pot only, in the preferred and illustrated embodiment it extends continuously around it. Any solder that spills from the pot is captured in the moat, and can be picked up and replaced with any convenient implement.

There are several advantages in replacing the solder that is spilled from the pot. First, it is obvious from a review of the manner in which the soldering vat works that the exact amount of solder in the pot is critical. The right amount provides the ideal meniscus and solder level for assuring optimal contact with the leads, without causing further solder to spill when the pins are immersed in it. Naturally, the ideal amount of liquid solder mass varies somewhat, but not much, depending on the number of lead pins inserted. Thus, by replacing the exact amount of solder that spilled out, the appropriate amount of solder can be maintained in the pot.

Additionally, the moat prevents the solder from spilling randomly on underlying surfaces and thus results in a cleaner work place, and lastly solder is a commodity that has a cost, and recycling saves money and resources.

The top edges of the solder pot must be horizontal, and horizontal adjustment feet provided at the corners of the base, not shown, allow the unit to be adjusted precisely once it is in its final resting place to establish the precise horizontalness of the upper edge of the solder pot. Aligned, or substantially aligned, with the top edges of the solder pot and the solder meniscus are at the tops of the elongated support braces 32. These braces are made of anodized aluminum in the preferred embodiment and extend not only the entire length of the elongated solder pot, but somewhat beyond it as can be seen in FIGS. 2 and 3.

Each of these braces had its counterpart as two separate braces in the parent invention. The use of a single brace on each side instead of two decreases the flexibility of the positioning of the brace structure slightly, but more than compensates for this by simplifying the use of t he vat as well as the manufacturing procedure.

Each of the brace bars 32 has a depending shaft 34 which fits inside the hollow posts 36 to permit vertical adjustment by means of set screws 38. Thus, the ends of each bar are more or less independently adjustable of one another. Each bar may also be moved closer to, or farther away from the central pot by loosening and re-tightening the wing nuts 40 as described in the parent patent. Thus a wide range of vertical and horizontal adjustment for the braces is provided.

Heat to the solder mass in the solder pot is provided by a pair of heater bars 42 which receive power from cables 44 which pass into the base or stand 10, and connect to a power cord, not shown. Details of the power connection is provided in the parent application.

Thus, in its improved form, the unit takes another step toward increasing the professionalism of the circuit board manufacturing business, and keeping pace with the strides that are being made in the integrated circuit and component end of the electronics manufacturing business.

It is hereby claimed:

1. A desoldering vat comprising:

(a) a stand;

(b) an elongated solder pot mounted on said stand and having an upper edge substantially defining a horizontal plane and a heating means to melt solder contained within said solder pot;

(c) a moat defined along at least one side of said pot to catch solder spilled out of said pot on said at least one side; and, (d) a horizontal support brace supported on said stand substantially parallel to said elongated pot and substantially spanning the entire length thereof.

2. Structure according to claim 1 wherein said support brace spans the entire length of said pot and extends beyond both ends thereof.

3. Structure according to claim 2 wherein said support brace is vertically supported on said stand on two spaced vertical posts.

4. Structure according to claim 3 wherein said support brace is independently adjustable on said two spaced vertical posts.

5. Structure according to claim 3 wherein said support brace is adjustably spaced from said elongated pot.

6. Structure according to claim 1 wherein said support brace is duplicated to define two substantially parallel support braces extended parallel to said pot and on opposite sides thereof.

* * * * *